United States Patent [19]
Lin

[11] Patent Number: 5,267,193
[45] Date of Patent: Nov. 30, 1993

[54] MULTI-VALUED MEMORY CELL USING BIDIRECTIONAL RESONANT TUNNELING DIODES

[75] Inventor: Hung C. Lin, Silver Spring, Md.

[73] Assignee: University of Maryland, College Park, Md.

[21] Appl. No.: 871,806

[22] Filed: Apr. 21, 1992

Related U.S. Application Data

[63] Continuation-in-part of Ser. No. 590,139, Sep. 28, 1990, Pat. No. 5,128,894.

[51] Int. Cl.⁵ .......................... G11C 5/06; G11C 11/56
[52] U.S. Cl. ...................................... 365/168; 365/71; 365/72; 365/175
[58] Field of Search ................. 365/168, 71, 72, 175, 365/105

[56] References Cited

U.S. PATENT DOCUMENTS

| | | | |
|---|---|---|---|
| 3,641,516 | 2/1972 | Castrucci et al. | 365/105 |
| 4,396,999 | 8/1983 | Malaviya | 365/175 X |
| 4,573,143 | 2/1986 | Matsukawa | 365/175 |
| 4,646,266 | 2/1987 | Ovshinsky et al. | 365/105 |
| 5,128,894 | 7/1992 | Lin | 365/168 |

FOREIGN PATENT DOCUMENTS 1221680  3/1986  U.S.S.R. ............... 365/105

Primary Examiner—Eugene R. LaRoche
Assistant Examiner—Son Dinh

[57] ABSTRACT

A memory cell for multi-valued logic utilizing bidirectional folding V−I characteristics. Two devices with bidirectional multiple folding characteristics, such as the V−I characteristics of resonant tunneling diodes, are connected in series across a power supply. Multiple stable operating points are established where the positive resistance portions the folding characteristics interesect and can be used to store multiple levels of signal. With bidirectional folding characteristics, the number of operating points can be doubled by using both a positive power supply and a negative power supply. The signal can be written in and read out at the connecting point of the two devices.

14 Claims, 2 Drawing Sheets

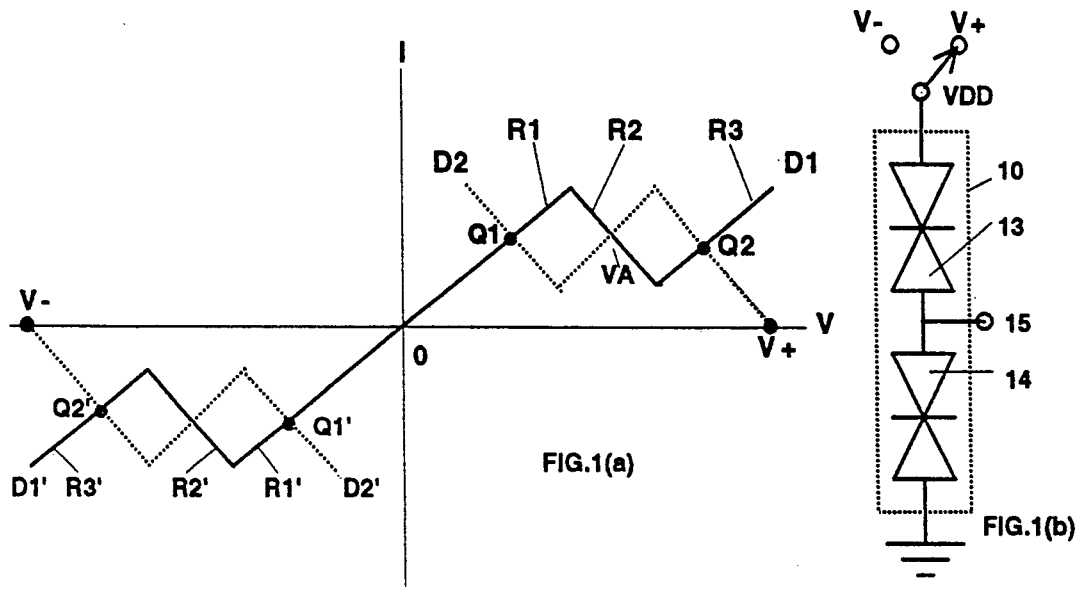
FIG.1(a)
FIG.1(b)
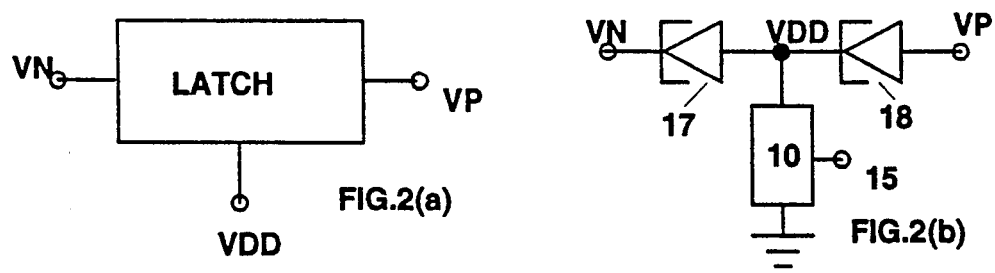
FIG.2(a)
FIG.2(b)
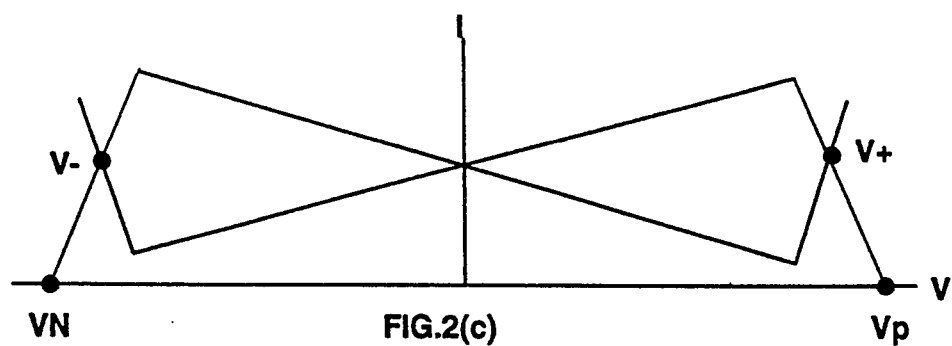
FIG.2(c)

MULTI-VALUED MEMORY CELL USING BIDIRECTIONAL RESONANT TUNNELING DIODES

This application is a continuation-in-part of U.S. application Ser. No. 07/590,139, filed Sep. 28, 1990 now U.S. Pat. No. 5,128,894.

BACKGROUND

Semiconductor memory today is based on binary systems. In each cell of a binary system memory, only two states can be stored; namely, "1" or "0". If the number of states in a memory cell can be increased without increasing the area of the cell, then the memory density can be increased. Since semiconductor memory constitutes the most widely used product of integrated circuits today, increasing the memory density is highly desirable.

In the co-pending and allowed U.S. Pat. application Ser. No. 07/590,139, a multi-valued memory cell was disclosed utilizing the folding voltage-current characteristics. However, the disclosed circuit, as well as the circuit disclosed by Matsukawa et al in U.S. Pat. No. 4,573,143, used only one polarity for power supply and the device folding V−I characteristic in the third quadrant was not utilized to increase the number of memory states.

SUMMARY

One object of this invention is to increase the density of semiconductor memory utilizing the bidirectional folding V−I characteristic. Another object this invention is to increase the logical states of a semiconductor memory cell to be multi-valued, i.e. more than two. Still another object of this invention is to have a simple semiconductor memory system. A further object is to implement a quantized analog memory system.

These objects are achieved by utilizing the bidirectional folding voltage-current (V−I) characteristics of two devices to produce many stable operating points, representing multiple logic states. Such bidirectional folding characteristics can be obtained with resonant tunneling diodes (RTD) using a positive power supply and a negative power supply. These multiple stable operating points can be set by "writing" into the cell an analog signal. The multi-valued voltages are then stored, and can later be sensed during the "reading" period.

BRIEF DESCRIPTION OF THE DRAWINGS

FIG. 1(a) shows bidirectional one-peak folding V−I characteristics in both the first quadrant and the third quadrant with dotted load lines. FIG. 1(b) shows the basic memory cell of this present invention using two resonant tunneling diodes and a switched power supply.

FIG. 2(a) shows the implementation of the present invention using a bistable latch. FIG. 2(b) shows the use of a pair of tunnel diodes as a latch. FIG. 2(c) shows graphically how a positive voltage and a negative voltage can be obtained with the tunnel diode latch.

DETAILED DESCRIPTION OF THE PREFERRED EMBODIMENT

Figure 3B:
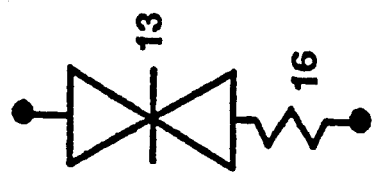
FIG. 3(a) shows the skewing of folding V−I characteristics when a resistor is connected in series with a tunneling diode as shown in FIG. 3(b), and the resultant operating points of a memory cell.

The underlying principle of this invention is to utilize the folding V−I characteristics to effect multiple stable stores states. A folding characteristic has a wavy shape. The solid line in FIG. 1 shows a triangular folding characteristic, typical of the voltage- current relationship of a resonant tunneling diode (RTD). The characteristic is unique in that the folding appears in both the first and the third quadrants and is different from conventional tunnel diodes which have only a folding characteristic in the first quadrant. FIG. 1(a), solid curve D1 shows a one peak folding V−I characteristic in the first and third quadrants with positive resistance along sections R1, R3, R1′, R3′ and negative resistance along sections —R2,—R2′.

The resonant tunneling diodes can have more than one peak and the V−I characteristics fold as many times as there are peaks both in the first quadrant and the third quadrant.

The basic memory cell 10 of this invention uses two devices 13, 14 with folding characteristics in series as shown in FIG. 1(b). One of the two devices can be considered as the load device for the other device. The stable operating points can be determined graphically from FIG. 1(a). In this figure, the load device characteristic D2 is plotted as dotted curves. Multiple stable operating points are located at the intersections of the positive resistance regions of the dotted load lines with that of the solid folding characteristic. The two series RTDs 17 and 18 shown in FIG. 1(b) are connected across a power supply VDD and ground. The juncture between the two RTDs 13, 14 is the output 15. The power supply can be of either positive or negative polarity.

When the power supply is positive with VDD=V+, the operation is in the first quadrant. During writing of the memory cell, any input voltage less than the intersecting voltage in the negative resistance region —R2 at section line VA eventually settles to the operating point Q1. Any input voltage greater than the intersecting voltage in the negative resistance region —R2 to the right of section line VA eventually settles to the operating point Q2. At the output terminal, there is invariably some capacitance (Co) at terminal 15. The current flowing in the pull-up device 13 charges Co and the current flowing in the pulldown device 14 discharges Co. If the initial voltage is less than that at the quiescent point Q1, I1 is greater than I2 and the capacitance Co is charged up till the voltage across Co reaches that at Q1 until equilibrium is reached. For initial voltage greater than that at Q1 but less than the intersecting voltage VA of the two RTDs, I2 is less than I1 and the capacitance discharges until the voltage across Co reaches that at Q1 when equilibrium is reached. Thus, the output voltage is quantized at either Q1 or Q2.

When a negative power supply VDD=V− is applied, the operation is in the third quadrant. The operating points are similar to that in the first quadrant except for opposite polarity, as indicated by Q1′ and Q2′. Thus by switching the polarity of the supply voltage as shown in FIG. 1(b), the number of operating points is doubled.

The switching of the power supply can be implemented with a latch as shown in FIG. 2(a), which is controlled by one bit of the writing signal. One convenient scheme is the Goto pair which uses a pair of tunnel diodes as a latch. The high speed operation of such a pair is well-known. As shown in FIG. 2(b), two tunnel diodes 17, 18 are connected in series between a positive VP and a negative power supply —VN. As in the memory cell 10, the operating points appearing at the joint of the two tunnel diodes can be triggered to the intersecting points of the two tunnel diode V—I characteristics V+ or V−, which serve as the positive and negative supply voltages for the memory cell 10. The triggering voltage can be furnished by the writing signal. A large positive writing voltage applied to the input/output terminal 15 of the memory cell can trigger the tunnel diode latch to settle at the operating point V+, and a large negative writing voltage can trigger the latch to settle at the operating point V−. Alternatively, the tunnel diode latch can be triggered through a separate terminal at the juncture of the two tunnel diodes at point VDD.

FIG. 1(b) shows how two one-peak RTDs can store $2\times(1+1)=4$ levels of information. If two n-peak RTDs are used for the memory cell, then there are $2\times(n+1)$ levels stored.

Figure 4:
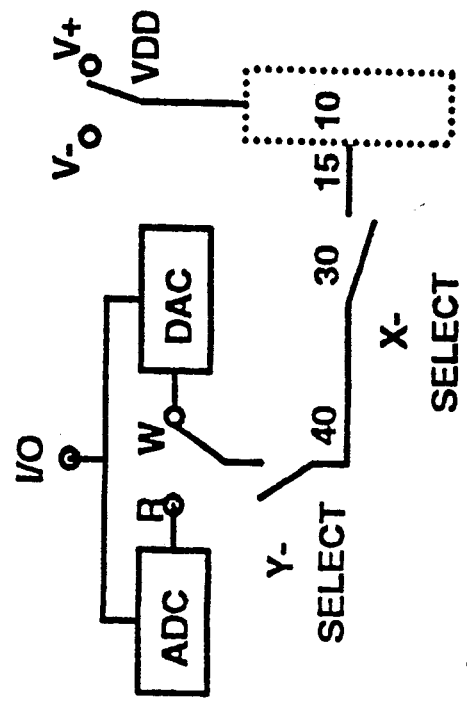
FIG. 4 shows a memory system using the memory cell of the present invention.

When a device with triangular folding V—I characteristic is connected in series with a resistance 16 as shown in FIG. 4(b), then the resultant V—I characteristic D3 becomes skewed like a saw-tooth, because the added resistance increases the positive resistance of the folding characteristic and decreases the negative resistance of the folding characteristic as shown by the solid curves in FIG. 4. This resistance may be external or internal to the RTDs.

When two devices with skewed characteristics ar connected in series, a memory cell is also formed. The operating points can be found graphically as shown in FIG. 4(a) with the dotted curves serving as the load lines. The supply voltage VDD is adjusted such that each positive resistance section intersects the positive resistance section of load device D3, D3' twice at points Q3, Q4 and Q5 in the first quadrant and Q3', Q4', Q5' in the third quadrant. For two n-peak devices, there can be $(2n+1)$ stable operating points or stored levels, or $2\times(2n+1)$ levels in two quadrants. Whether there are $n+1$ states or $2n+1$ states in one quadrant depends on the supply voltage.

The two devices with folding characteristics connected in series need not be the same. The number of peaks need not be the same. Some of the combinations have been described in detail in the co-pending U.S. application Ser. No. 07/590,139. In general, when an n-peak device is connected in series with a $n-1$ peak device, there can be $2n$ stable states in each quadrant.

Figure 3A:
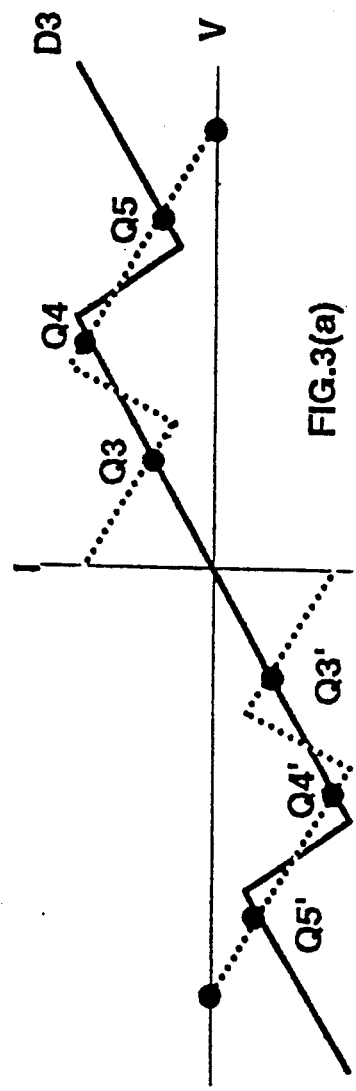

A memory organization incorporating the memory cells in the previous figures is shown in FIG. 4. A memory cell 10, operating in FIG. 1(a) mode or in FIG. 3(a) mode, is placed at the crosspoint of a conventional X-Y memory matrix. The memory cell is addressed by means of an X-select switch 30 and a Y-select switch 40. Such addressing scheme is well known in the memory art. After X-select and Y-select, the memory cell is coupled directly to an analog signal or to a digital analog converter (DAC) during writing, through which an input signal is written into the memory cell 10. The digital input signal is not limited to binary signals, which are most commonly used. The analog signal output should have the same number of quantum level as the, memory cell used. If the digital signal is multi-valued and has the same number of quantum levels as the memory cell, then the DAC may not be needed.

During reading, the Y-select switch 40 is connected to an analog -to -digital converter. The analog information stored in the addressed memory cell is then converted into a digital signal. Again, the digital signal need not be binary. If the quantum levels are the same as the analog signal stored, then the analog to digital converter may not be needed, and the memory cell effectively stores a quantized analog signal.

Other combinations of devices with varying folding characteristics with different number of peaks different degrees of skewing and varying supply voltages would also be possible. This invention is not limited only to the conditions described.

What is claimed is:

1. A memory cell for storing plural logical states, comprising:
    a first device having a first bidirectional folding voltage-current (V—I) characteristic; and
    a second device having a second bidirectional folding V—I characteristic,
    wherein said devices are adapted to be connected in series across either a positive power supply or a negative power supply with respect to a reference voltage, and define operating points of said memory cell which correspond to said logical states,
    said operating points being defined by intersections of regions of said first and second folding characteristics which correspond to positive resistance sections of said first and second foldings, and
    said intersections being defined by overlaying said first folding characteristic with said second folding characteristic.

2. A memory cell as recited in claim 1, wherein said means for switching is a bistable latch, the output of which can furnish either said positive power supply or said negative power supply.

3. A memory cell as recited in claim 1, wherein said bistable latch comprises a pair of tunnel diodes connected in series between a second positive power supply and a second negative power supply, with connection between said pair of tunnel diodes serving as said output of said latch.

4. A memory cell as recited in claim 1, wherein said means for switching and said logical states are set by writing input signals to said cell.

5. A memory cell as recited in claim 1, wherein said input signals are applied to the juncture of said first device and said second device.

6. A multi-valve memory cell as recited in claim 1, wherein said first and second folding characteristics each have n-peaks, thereby producing $n+1$ logical states for said positive power supply and another $n+1$ logical states for said negative power supply.

7. A memory cell as recited in claim 1, wherein at least one of said devices is connected in series with a resistor to produce a skewed said folding V—I characteristic, of the said device with said resistor in series, and to increase the number of said intersections in each one of said said positive resistance sections.

8. A memory cell as recited in claim 9, wherein said positive power supply is adjusted to produce $2n+1$ logical states, and said negative power supply is adjusted to produce $2n+1$ logical states.

9. A memory cell as recited in claim 9, wherein said positive power is adjusted to produce $2n+1$ logical states, and said negative power supply is adjusted to produce $n+1$ logical states.

10. A memory cell as recited in claim 1, wherein two said folding characteristics do not have the same number of peaks.

11. A memory cell as recited in claim 1, wherein said first folding characteristic has n peaks and said second folding characteristic has (n−1) peaks, and said positive power supply is adjusted to produce 2n number of logical states, and said negative power supply is adjusted to produce another 2n logical states.

12. A memory cell as recited in claim 1, wherein said first and second devices are resonant tunneling diodes.

13. A memory system for storing plural logic states, comprising:
    an array of memory cells;
    address means for addressing said memory cells; and
    reading means for reading said memory cells;
    writing means for writing said said memory;
    wherein said memory cells comprise a first device having a first bidirectional V−I characteristic, and a second device having a second bidirectional V−I characteristics;
    wherein said devices are adapted to be connected in series across either a positive power supply or a negative power supply with respect to a reference, and said first and second bidirectional folding characteristics define operating points of said memory cell which correspond to said logical states.

14. A memory system as recited in claim 13, wherein said writing means comprises a a digital to analog converter having a number of quantized levels;
    said reading means comprises an analog to digital converter having said number of quantized levels;
    each of said memory cells have a number of operating points equal to said number of quantized levels.

* * * * *